United States Patent [19]

Bryan

[11] Patent Number: 5,280,510
[45] Date of Patent: Jan. 18, 1994

[54] MICROPARTICLE COATING ON INSIDE OF FUEL RODS AND OTHER FUEL ASSEMBLY COMPONENTS

[75] Inventor: William J. Bryan, Granby, Conn.

[73] Assignee: Combustion Engineering, Inc., Windsor, Conn.

[21] Appl. No.: 951,106

[22] Filed: Sep. 25, 1992

[51] Int. Cl.$^5$ ............................................. G21C 3/00
[52] U.S. Cl. .................. 376/414; 376/419; 376/416
[58] Field of Search ............... 376/417, 414, 416, 419, 376/415; 976/53; 427/37, 123, 239, 376.2, 376.3

[56] References Cited

U.S. PATENT DOCUMENTS

| | | | |
|---|---|---|---|
| 4,411,861 | 10/1983 | Steinberg | 376/417 |
| 4,541,984 | 9/1985 | Palmer | 376/415 |
| 4,587,088 | 5/1986 | Radford | 376/419 |
| 4,661,233 | 4/1987 | Glasser | 204/298 |
| 4,849,160 | 7/1989 | Hertz | 376/416 |
| 5,055,319 | 10/1991 | Bunshah et al. | 427/38 |
| 5,147,598 | 9/1992 | Kapil | 376/419 |
| 5,153,901 | 10/1992 | Shoulders | 378/119 |
| 5,173,331 | 12/1992 | Adams, Jr. et al. | 427/123 |

OTHER PUBLICATIONS

Gated Field Emitter Failures: Experiment and Theory. J. Browning, N. E. McGruer, S. Meassick, Chung Chan, William J. Bintz, and Mark Gilmore.

Primary Examiner—Donald P. Walsh
Assistant Examiner—Meena Chelliah
Attorney, Agent, or Firm—L. James Ristas; John H. Mulholland

[57] ABSTRACT

A method for coating the inside surface (18) of tubular components (16) of a nuclear fuel assembly, including the steps of supporting the component within a vacuum chamber (12), positioning a source rod (20) having a field emitter structure (22) within the component, the structure being formed of material to be coated on the surface, and inducing an electrical current flow (26) through the rod sufficient to evaporate at least a portion of the emitter structure, whereby the evaporated material of the emitter structure is deposited on and adheres to the surface as a coating. Optionally, the vacuum chamber is backfilled with a reactive gas (38), and the material evaporated from the emitter structure chemically reacts with the gas before adhering to the surface. The reactive gas can be one of nitrogen, oxygen, or carbon plasma and the coating adhered to the component can be one of a nitride, oxide, or carbide, respectively.

20 Claims, 2 Drawing Sheets

MICROPARTICLE COATING ON INSIDE OF FUEL RODS AND OTHER FUEL ASSEMBLY COMPONENTS

BACKGROUND OF THE INVENTION

The present invention pertains to nuclear fuel assemblies, and more particularly, to the coating of fuel assembly components.

Although coating the inside of fuel assembly components has been recognized as providing significant advantages, the small inside diameters, high aspect ratios, and high costs of conventional coating processes, have stymied commercialization of such improved fuel assembly components. Two pending U.S. applications represent a significant advance in the state of the art in this respect.

U.S. patent application Ser. No. 07/924,731, "Sputtering Process Burnable Poison Coating" (Bryan et al), is directed to a method for sputter coating the inside surface of a fuel assembly tubular component with absorber material such as a burnable poison or hydrogen getter. U.S. patent application Ser. No. 07/924,732, "Fuel Assembly Sputtering Process" (Bryan et al), is directed to a method for sputter coating the inside surface of fuel assembly tubular components such as nuclear fuel rods or control rod guide tubes, with wear or corrosion resistant material. The foregoing U.S. applications, the disclosures of which are hereby incorporated by reference, describe the so called Linear Magnetron Sputtering process as the preferred sputtering technique. The sputtering process disclosed in these applications requires active confinement of a plasma within the tubular substrate to be coated, as well as an active cooling system.

SUMMARY OF THE INVENTION

It is thus an object of the present invention to provide an apparatus and method for coating burnable poison material, wear resistant and corrosion resistant materials, or hydrogen getter materials, on the inner surface of nuclear fuel assembly tubular components such as fuel rods, control rods, poison rods instrument thimbles, and the like.

It is a related object of the invention, to deposit microparticle coatings on the inside of nuclear fuel assembly components, by an apparatus and a process that is simpler and more cost effective than prior art sputtering.

These objects are achieved by a method and apparatus for coating the inside surface of a tubular component of a nuclear fuel assembly, in which the component is supported within a vacuum chamber, and a source rod having an evaporatable field emitter structure is positioned within the component. The field emitter is formed of a material to be coated on the inside surface of the component. An electrical current is passed through the rod at an amperage sufficient to evaporate at least a portion of the emitter structure. The evaporated material of the emitter then deposits on and adheres to the component surface, as a microparticle coating.

In some embodiments, the desired coating is a compound, such as BN, which cannot itself constitute the source rod. In such a case, the vacuum chamber is backfilled with a reactive gas, such as nitrogen, and the source rod material, such as boron, when evaporated from the emitter structure chemically reacts with the gas to form the compound, which adheres to the component inner surface.

The invention facilitates coating the inside of fuel rod cladding and other components, with a high degree of uniformity. Moreover, the invention allows the simultaneous deposition of multiple atom species to form alloys. The crystal instructure of the coating can be adjusted by adjusting the incident ion energy with respect to the work pieces (i.e., component inner surfaces) to be coated. The small size and variable density of emitter arrays afford great flexibility in the nature of the coatings that can be deposited.

BRIEF DESCRIPTION OF THE DRAWINGS

These and other objects and advantages of the invention will be described below with reference to the accompanying drawings, in which.

DESCRIPTION OF THE PREFERRED EMBODIMENT

Figure 1:
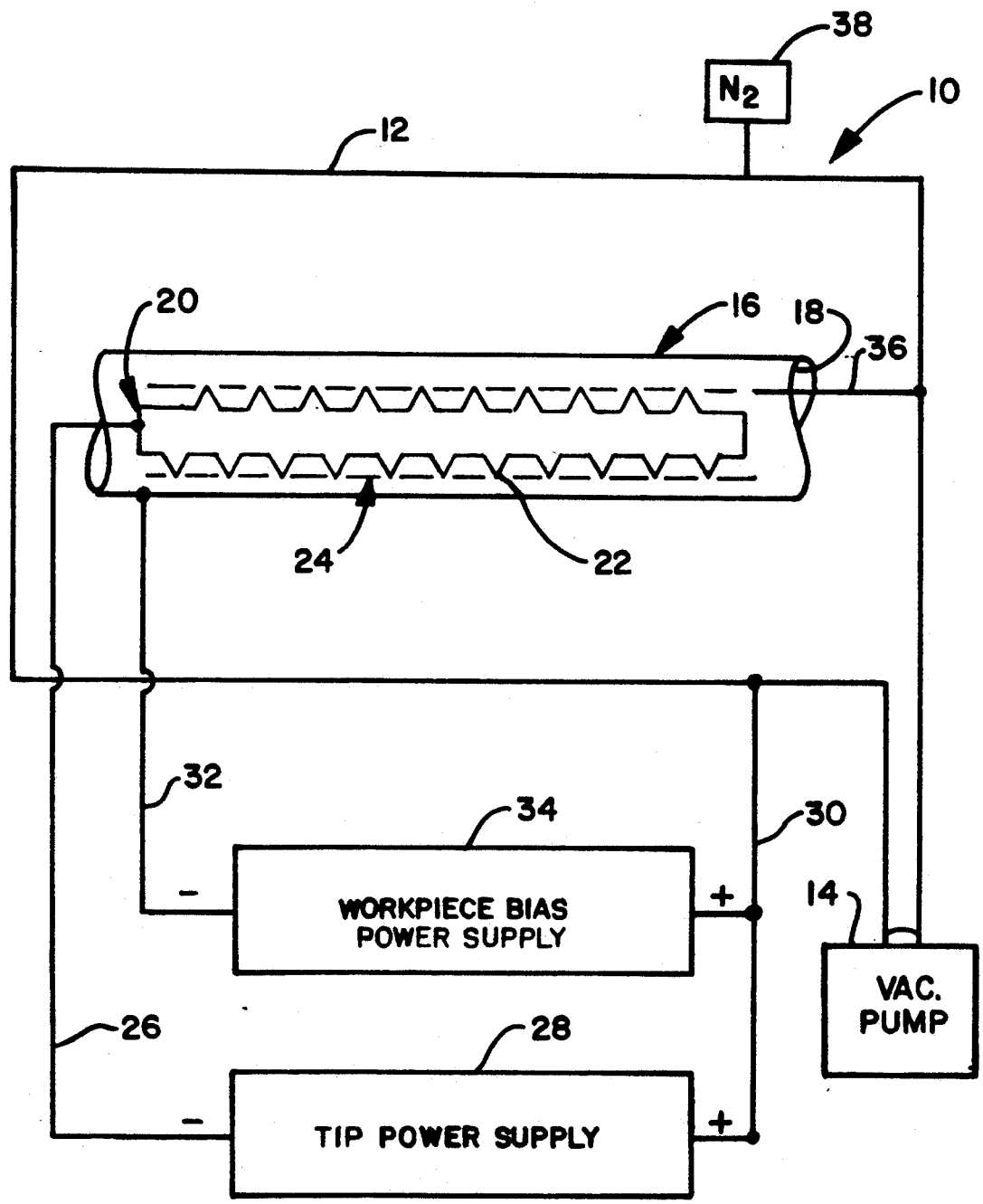
FIG. 1 is a schematic representation of a system for coating the inside of a tubular fuel assembly component in accordance with the invention.

FIG. 1 is a schematic representation of a system 10 for implementing the present invention. A vacuum chamber 12 is connected to a vacuum pump 14 by which the ambient air can be removed. The tubular component 16 to be coated, is supported within the vacuum chamber. A source material rod 20 is positioned, preferably axially, within the component 16, in spaced relation from the confronting inside surface 18. The rod 20 includes a distribution of field emitter structure having a generally nodular, and preferably pointed shape, which will hereafter be referred to as emitter tips 22.

The rod 20 must, of necessity, have a rather small effective outside diameter, especially when used for coating the inside of nuclear fuel rod tubing, which is generally on the order of 0.5 inch. The emitter can be formed as a wire on which the desired source material for the coating, has been flame sprayed. Techniques for fabricating the emitter rod per se, do not form a part of the present invention, but rather can be adapted for use in the present invention, by reference to available literature on conventional field emitter technology. In some instances, the rod 20 can be of a type having gated field emitters (the gates 24 are shown in FIG. 1 as a dashed line).

Figure 2:
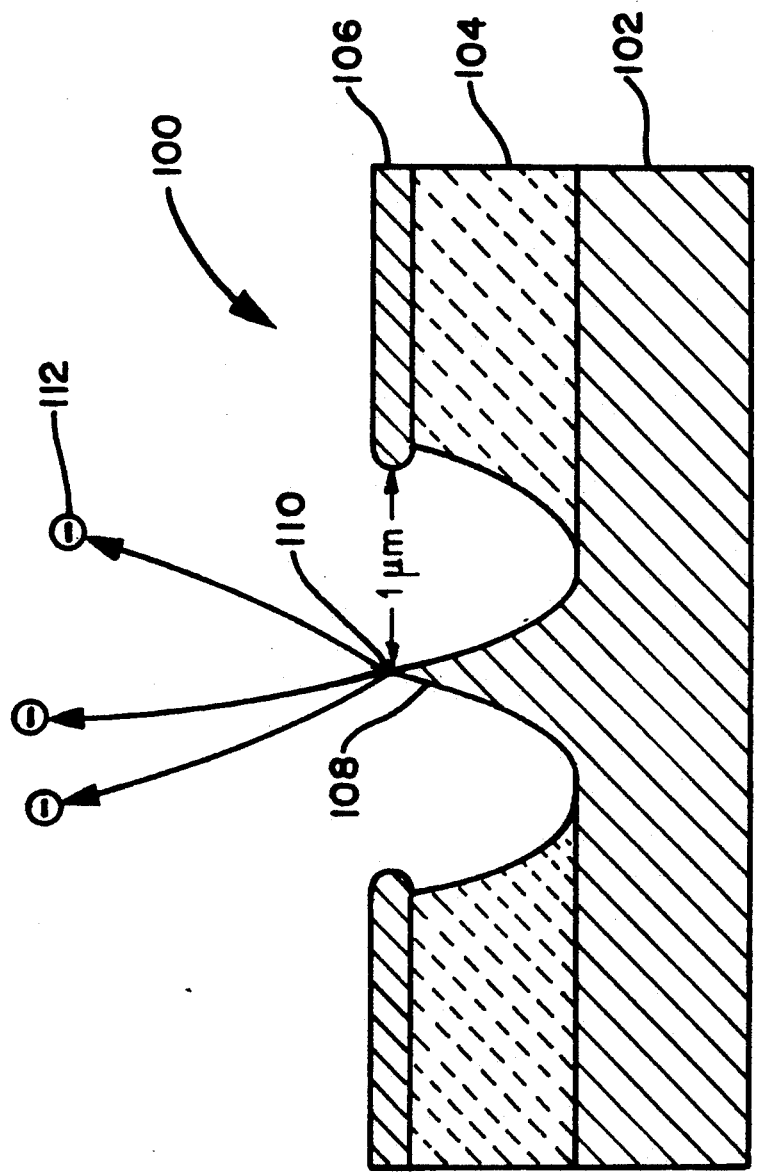
FIG. 2 is a schematic representation of a gate-type of field emitter rod usable with the present invention.

FIG. 2 shows a schematic of a gated field emitter rod 100, wherein the rod core 102 has nodular structure such as 108 formed thereon, preferably including a point 110. An insulating material 104 is layered on the core material 102, and a top layer of conductive material 106 covers the insulating material 104. A basin, or bowl is formed by the absence of insulating and conductor material 104, 106 in a region immediately surrounding the emitter structure 108. As an example, the distance from the point 110 to the insulating layer 106 is on the order of the height or projection of the point 110 from the core 102, such distance typically being in the range of about 1–10 $\mu$m.

In the conventional utilization of a gated field emitter such as shown in FIG. 2, the emitter tip or nodule 108 is biased negatively with respect to its gate 106. This structure will emit electrons 112 if the electrical field at the emitter point 110 is large enough to induce field emission from the tip material. Above a critical current, a gated field emitter structure 108 will exhibit a failure which will cause the point 110 and then a portion of the rest of the tip 108 to be evaporated. This process has been investigated by J. Browning, N. E. McGruer, S. Meassick, C. Chan, W. Bintz and M. Gilmor, in an article entitled "Gated Field Emitter Failures: Experiment and Theory", to be published in IEEE Transactions, Plasma Science, October, 1992.

As shown in FIG. 1, the tips 22 are negatively biased via tip power supply 28 and conductor 26, whereas the gates 24 are positively biased via power supply 34 and conductors 30,36. The component substrate can be negatively biased via conductor 32. With non-gated field emitters, which are preferred for the present invention, the tips 22 are biased negatively via conductor 26 and tip power supply 28, whereas the workpiece, i.e., the tubular component 16, would be positively biased via conductors 30,36 and workpiece bias power supply 34.

Above a critical current failure of the emitter tip 22 will occur, causing a portion of the tip to be evaporated as microparticles. Because of the small size of the field emitter structures, i.e., less than 10 $\mu$m feature size, arrays of field emitters can be used to deposit material on large work pieces while single emitters can be utilized for deposition of material on small workpieces. The size of the emitter tips (volume of material available in each tip), surface density of emitter tips, and the energy available for each tip failure can be used to adjust the amount of material evaporated and, therefore, the thickness of a deposited coating on a workpiece. Arrays of field emitters can be fabricated on sources of arbitrarily complex shape and used for deposition on complexly shaped work pieces. In particular, emitters can be fabricated on a small wire appropriately sized for use on the inside of fuel rods, instrument thimble tubes, burnable poison rods, control rods, or control rod guide tubes. The rate of failures, energy available for each failure, and the surface density of emitters can be used to adjust the rate of deposition, coating thickness and coating parameters.

A large fraction of the material evaporated from the field emitter is ionized, allowing a potential gradient between the emitter tip and work piece to accelerate the ions thereby changing the properties of the deposited coating, increasing adherance, decreasing crystal size. The material of the deposited coating is determined by the composition of the emitter tips. Thus, the composition of the deposited coating can be changed by adjusting the composition of individual emitter tips or by making individual emitter tips of different material. The tips 22 thus need not be of the same material as the carrying core of rod 20 and all tips need not be of the same material.

As represented at 38 in FIG. 10, the atmosphere within the vacuum chamber 12 can be backfilled with a reactive gas such as nitrogen or oxygen, or carbon vapor plasmas can be introduced, whereby the source material evaporated from the tips 22 chemically reacts with the nitrogen, oxygen and/or carbon, before adhering to the component surface 18. In any event, the tip material deposits on the component substrate surface 18, either in the form as originated on the emitter, or in a form as modified by reaction with the reactive gas in the chamber.

The ability to achieve different coatings along different longitudinal regions of the component, with the ability to layer one component upon another, as described in said copending applications, is another advantage achievable with the present invention. Thus, where desirable, neutron absorber poison material can be coated with and in combination with wear resistant or hydrogen getter material. The following tables list particularly desirable coatings that are achievable with the present invention.

Table 1 lists a variety of burnable poison metals that can be deposited in accordance with the present invention (BN is a burnable poison coating that can be formed with the use of nitrogen as the reaction gas introduced via reaction gas source 38):

TABLE 1

| Burnable Poison Metals and Metallic Compounds |
| --- |
| Gadolinium |
| Erbium |
| Boron |
| $ZrB_2$ |
| BN |
| $TiB_2$ |

Table 2 is a representative list of burnable poison ceramic materials including glasses that are usable with the present invention:

TABLE 2

| Burnable Poison Ceramics and Glasses |
| --- |
| 20 $Li_2O80B_3$ |
| 15 $Na_2O85B$ 20 |
| $B_4C$ |

Table 3 is a representative list of getter material that can be deposited in accordance with the present invention:

TABLE 3

| Getter Material |
| --- |
| Yttrium |
| Zirconium-Nickel alloys |
| Zirconium-Titanium-Nickel alloys |

Table 4 is a representative list of wear and/or corrosion resistant metal compounds.

TABLE 4

| Metals and Metallic Compounds |
| --- |
| ZrN |
| TiN |
| CrN |
| HfN |
| TaAlVN |
| TaN |

Table 5 is a representative list of wear and/or corrosion resistant ceramic materials including glasses that are usable with the present invention:

TABLE 5

| Ceramics and Glasses |
| --- |
| $Zr_2O_3$ |
| $Al_2O_3$ |
| TiCN |
| TiC |
| CrC |
| ZrC |
| WC |
| Calcium Magnesium aluminosilicate |
| Sodium Borosilicate |

TABLE 5-continued

| Ceramics and Glasses |
| --- |
| Calcium Zinc borate |

I claim:

1. A method for coating the inside surface of tubular components of a nuclear fuel assembly, comprising:
   supporting the component within a vacuum chamber;
   positioning a source rod having a field emitter tip structure within the component, said structure being formed of material to be coated on said surface;
   inducing an electrical current flow through the rod sufficient to evaporate at least a portion of the emitter structure;
   whereby the evaporated material of the emitter structure is deposited on and adheres to said surface as a coating.

2. The method of claim 1, wherein
   the vacuum chamber is backfilled with a reactive gas, and
   the material evaporated from the emitter structure chemically reacts with the gas before adhering to said surface.

3. The method of claim 2, wherein the reactive gas is one of nitrogen, oxygen, or carbon plasma and the coating adhered to the component is one of a nitride, oxide, or carbide, respectively.

4. The method of claim 1, wherein the material is a neutron burnable poison metal.

5. The method of claim 4, wherein the material is one of gadolinium, erbium, or boron.

6. The method of claim 1, wherein the coating is a neutron burnable poison metal compound.

7. The method of claim 6, wherein the coating is one of $ZrB_2$, or $TiB_2$.

8. The method of claim 1, wherein the coating is a neutron burnable poison ceramic.

9. The method of claim 8, wherein the coating is $B_4C$.

10. The method of claim 1, wherein the material is a neutron burnable poison glass.

11. The method of claim 10, wherein the material is one of $20Li_1 O80B_3$ or $15 Na_2 O85B 20$.

12. The method of claim 1, wherein the material is a hydrogen getter.

13. The method of claim 12, wherein the material is one of yttrium, a zirconium nickel alloy, or a zirconium-titanium-nickel alloy.

14. The method of claim 2, wherein the reactive gas is nitrogen, the source material is boron, and the coating is BN.

15. The method of claim 2, wherein the reactive gas nitrogen and the coating is a wear resistant nitride.

16. The method of claim 15, wherein the material is a metal and the coating is one of ZrN, TiN, CrN, HfN, TaAlVN, or TaN.

17. The method of claim 1, wherein the coating is a corrosion resistant ceramic or glass.

18. The method of claim 1, wherein the coating is one of $Zr_2O_3$, $Al_2O_3$, TiCN, TiC, CrC, ZrC, WC, calcium magnesium aluminosilicate, sodium borosilicate, or calcium zinc borate.

19. A method for coating the inside surface of a tubular component for a nuclear fuel assembly, comprising:
   supporting the component within a vacuum chamber;
   positioning a source rod having a gated field emitter structure within the component, said structure being formed of material to be coated on said surface;
   inducing an electrical current flow through the rod sufficient to evaporate at least a portion of the emitter structure;
   whereby the evaporated material of the emitter structure is deposited on and adheres to said surface as a coating.

20. The method of claim 19, wherein
   the vacuum chamber is backfilled with a reactive gas, and
   the material evaporated from the emitter structure chemically reacts with the gas before adhering to said surface.

* * * * *

UNITED STATES PATENT AND TRADEMARK OFFICE
CERTIFICATE OF CORRECTION

PATENT NO. : 5,280,510
DATED : January 18, 1994
INVENTOR(S) : William J. Bryan

It is certified that error appears in the above-indentified patent and that said Letters Patent is hereby corrected as shown below:

Column 5, line 41, "I" should be --1--.

Signed and Sealed this

Thirty-first Day of December, 1996

Attest:

BRUCE LEHMAN

*Attesting Officer*     *Commissioner of Patents and Trademarks*